(12) United States Patent 
Pemmasani et al.

(10) Patent No.: US 12,338,530 B2
(45) Date of Patent: Jun. 24, 2025

(54) SHAPED SHOWERHEAD FOR EDGE PLASMA MODULATION

(71) Applicant: Applied Materials, Inc., Santa Clara, CA (US)

(72) Inventors: Saketh Pemmasani, Hyderabad (IN); Daemian Raj Benjamin Raj, Fremont, CA (US); Xiaopu Li, San Jose, CA (US); Akshay Dhanakshirur, Hubli (IN); Mayur Govind Kulkarni, Bangalore (IN); Madhu Santosh Kumar Mutyala, Santa Clara, CA (US); Deenesh Padhi, Sunnyvale, CA (US); Hang Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 17 days.

(21) Appl. No.: 17/371,575

(22) Filed: Jul. 9, 2021

(65) Prior Publication Data

US 2023/0011938 A1 Jan. 12, 2023

(51) Int. Cl.
*H01J 37/32* (2006.01)
*C23C 16/455* (2006.01)
*C23C 16/505* (2006.01)

(52) U.S. Cl.
CPC ...... *C23C 16/45565* (2013.01); *C23C 16/505* (2013.01); *H01J 37/32082* (2013.01);
(Continued)

(58) Field of Classification Search
CPC ............ C23C 16/45565; C23C 16/505; C23C 16/4584; C23C 16/4586; C23C 16/509;
(Continued)

(56) References Cited

U.S. PATENT DOCUMENTS 6,110,556 A * 8/2000 Bang ................. H01L 21/67069
118/728
6,245,192 B1 * 6/2001 Dhindsa ............ C23C 16/45572
438/731
(Continued)

FOREIGN PATENT DOCUMENTS

CN 107393802 A 11/2017
TW I374497 B 10/2012
(Continued)

OTHER PUBLICATIONS

International Search Report and Written Opinion mailed on Oct. 26, 2022 in International Patent Application No. PCT/US2022/035917, 8 pages.

*Primary Examiner* — Rudy Zervigon
(74) *Attorney, Agent, or Firm* — Kilpatrick Townsend & Stockton LLP

(57) ABSTRACT

Exemplary semiconductor processing chambers may include a chamber body. The chambers may include a substrate support disposed within the chamber body. The substrate support may define a substrate support surface. The chambers may include a showerhead positioned supported atop the chamber body. The substrate support and a bottom surface of the showerhead may at least partially define a processing region within the semiconductor processing chamber. The showerhead may define a plurality of apertures through the showerhead. The bottom surface of the showerhead may define an annular groove or ridge that is positioned directly above at least a portion of the substrate support.

16 Claims, 6 Drawing Sheets

(52) U.S. Cl.
CPC .... *H01J 37/3244* (2013.01); *H01J 37/32532* (2013.01); *H01J 2237/327* (2013.01)

(58) Field of Classification Search
CPC ............... C23C 16/507; C23C 16/5096; H01J 37/32082; H01J 37/3244; H01J 37/32532; H01J 2237/327; H01J 15/00; H01J 37/32091; H01J 37/32623; H01J 37/32009; H01J 37/20; H01J 37/321; H01J 37/32192; H01J 2237/334; H01L 21/67069
USPC ........ 118/715, 723 E, 723 MW; 156/345.33, 156/345.34
See application file for complete search history.

(56) References Cited

U.S. PATENT DOCUMENTS

| | | | | |
|---|---|---|---|---|
| 6,461,435 | B1* | 10/2002 | Littau | C23C 16/45565 118/724 |
| 8,008,596 | B2* | 8/2011 | Koshiishi | H01J 37/32009 219/121.52 |
| 9,714,465 | B2* | 7/2017 | Tsuei | C23C 16/45559 |
| 11,584,993 | B2* | 2/2023 | Lee | C23C 16/4412 |
| 2006/0225649 | A1* | 10/2006 | Courville | C23C 16/455 427/248.1 |
| 2009/0200269 | A1* | 8/2009 | Kadkhodayan | H01J 37/32091 427/523 |
| 2010/0252197 | A1 | 10/2010 | Kadkhodayan et al. | |
| 2011/0114261 | A1* | 5/2011 | Matsumoto | H01L 21/67126 156/345.33 |
| 2011/0240598 | A1* | 10/2011 | Okayama | H01J 37/32192 156/345.36 |
| 2012/0012556 | A1* | 1/2012 | Matsumoto | H01L 21/67248 156/345.24 |
| 2012/0241090 | A1* | 9/2012 | Yoshikawa | H01J 37/3244 156/345.41 |
| 2012/0267048 | A1* | 10/2012 | Moyama | H01J 37/32229 156/345.33 |
| 2013/0014895 | A1* | 1/2013 | Kawamata | H01J 37/3244 156/345.33 |
| 2013/0126206 | A1* | 5/2013 | Zhou | H01J 37/32091 174/68.1 |
| 2014/0090599 | A1* | 4/2014 | Saitou | B05B 1/005 118/728 |
| 2014/0099734 | A1* | 4/2014 | Saito | C23C 16/045 118/723 MW |
| 2014/0170842 | A1* | 6/2014 | Noro | H10D 64/017 438/585 |
| 2014/0225504 | A1* | 8/2014 | Kaneko | H05H 1/46 118/712 |
| 2015/0064924 | A1* | 3/2015 | Takaba | H01L 21/0276 438/717 |
| 2015/0140822 | A1* | 5/2015 | Yoshimura | H01L 21/31116 156/345.24 |
| 2015/0187582 | A1* | 7/2015 | Ueda | H01J 37/32412 438/513 |
| 2015/0214011 | A1* | 7/2015 | Kaneko | H01J 37/32119 315/111.21 |
| 2016/0177445 | A1 | 6/2016 | Takahashi et al. | |
| 2017/0009338 | A1* | 1/2017 | Saito | H01J 37/32119 |
| 2017/0062227 | A1* | 3/2017 | Ishikawa | H01J 37/3244 |
| 2018/0090300 | A1* | 3/2018 | Zhao | C23C 16/4404 |
| 2018/0337081 | A1 | 11/2018 | Ye | |
| 2021/0032753 | A1* | 2/2021 | Ravi | C23C 16/45565 |
| 2021/0242036 | A1* | 8/2021 | Yamazaki | H01J 37/32715 |

FOREIGN PATENT DOCUMENTS

| | | |
|---|---|---|
| TW | I395517 B | 5/2013 |
| TW | 201941298 A | 10/2019 |
| TW | 202109603 A | 3/2021 |
| TW | 202113144 A | 4/2021 |
| WO | 2019023429 A2 | 1/2019 |
| WO | 2021124898 A1 | 6/2021 |

* cited by examiner

SHAPED SHOWERHEAD FOR EDGE PLASMA MODULATION

TECHNICAL FIELD

The present technology relates to components and apparatuses for semiconductor manufacturing. More specifically, the present technology relates to processing chamber distribution components and other semiconductor processing equipment.

BACKGROUND OF THE INVENTION

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

BRIEF SUMMARY OF THE INVENTION

Exemplary semiconductor processing chambers may include a chamber body. The chambers may include a substrate support disposed within the chamber body. The substrate support may define a substrate support surface. The chambers may include a showerhead positioned supported atop the chamber body. The substrate support and a bottom surface of the showerhead may at least partially define a processing region within the semiconductor processing chamber. The showerhead may define a plurality of apertures through the showerhead. The bottom surface of the showerhead may define an annular groove that is positioned directly above at least a portion of the substrate support.

In some embodiments, the substrate support may include a heater pocket that protrudes upward from an upper surface of the substrate support. The annular groove may have a size and shape that corresponds to a size and shape of the heater pocket. The chambers may include an RF mesh embedded within the substrate support. A vertical distance between the RF mesh and the bottom surface of the showerhead may vary across a length of the showerhead. The annular groove may be disposed radially outward of the plurality of apertures. The bottom surface of the showerhead may define an annular ridge that protrudes downward from the bottom surface. The annular groove and the annular ridge may be in contact with one another. The annular groove and the annular ridge may be spaced apart from one another. An inner edge and an outer edge of the annular groove may be tapered. A depth of the groove may be between about 5 mils and 100 mils.

Some embodiments of the present technology may encompass semiconductor processing chambers. The chambers may include a chamber body. The chambers may include a substrate support disposed within the chamber body. The substrate support may define a substrate support surface. The chambers may include a showerhead positioned supported atop the chamber body. The substrate support and a bottom surface of the showerhead may at least partially define a processing region within the semiconductor processing chamber. The showerhead may define a plurality of apertures through the showerhead. The bottom surface of the showerhead may define an annular relief feature.

In some embodiments, the annular relief feature may include one or both of a groove and a ridge. At least a portion of the annular relief feature may be disposed radially inward of at least one of the plurality of apertures. A subset of the plurality of apertures may be disposed within the annular relief feature. Each of the plurality of apertures may include an upper portion and a lower portion. The lower portion may have a smaller diameter than the upper portion. A lower portion of each of the plurality of apertures within the subset may have a same size as each of the plurality of apertures that are not included in the subset. A depth or a height of the relief feature may be constant across a width of the relief feature. A depth or a height of the relief feature may vary across a width of the relief feature. The bottom surface of the showerhead may define an additional annular relief feature.

Some embodiments of the present technology may encompass methods of processing a substrate. The methods may include flowing a precursor into a processing chamber. The processing chamber may include a showerhead and a substrate support on which a substrate is disposed. A processing region of the processing chamber may at least partially defined between the showerhead and the substrate support. The showerhead may define a plurality of apertures through the showerhead. A bottom surface of the showerhead may define an annular relief feature. The methods may include generating a plasma of the precursor within a processing region of the processing chamber. The methods may include depositing a material on the substrate.

In some embodiments, the annular relief feature may include one or both of a groove and a ridge. The substrate support may include an RF mesh. A vertical distance between the RF mesh and the bottom surface of the showerhead may vary across a length of the showerhead.

Such technology may provide benefits over conventional systems and techniques. For example, embodiments of the present technology may allow controlled deposition at an edge region of a substrate. Additionally, the components may maintain edge region plasma generation to reduce effects on plasma density and distribution. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
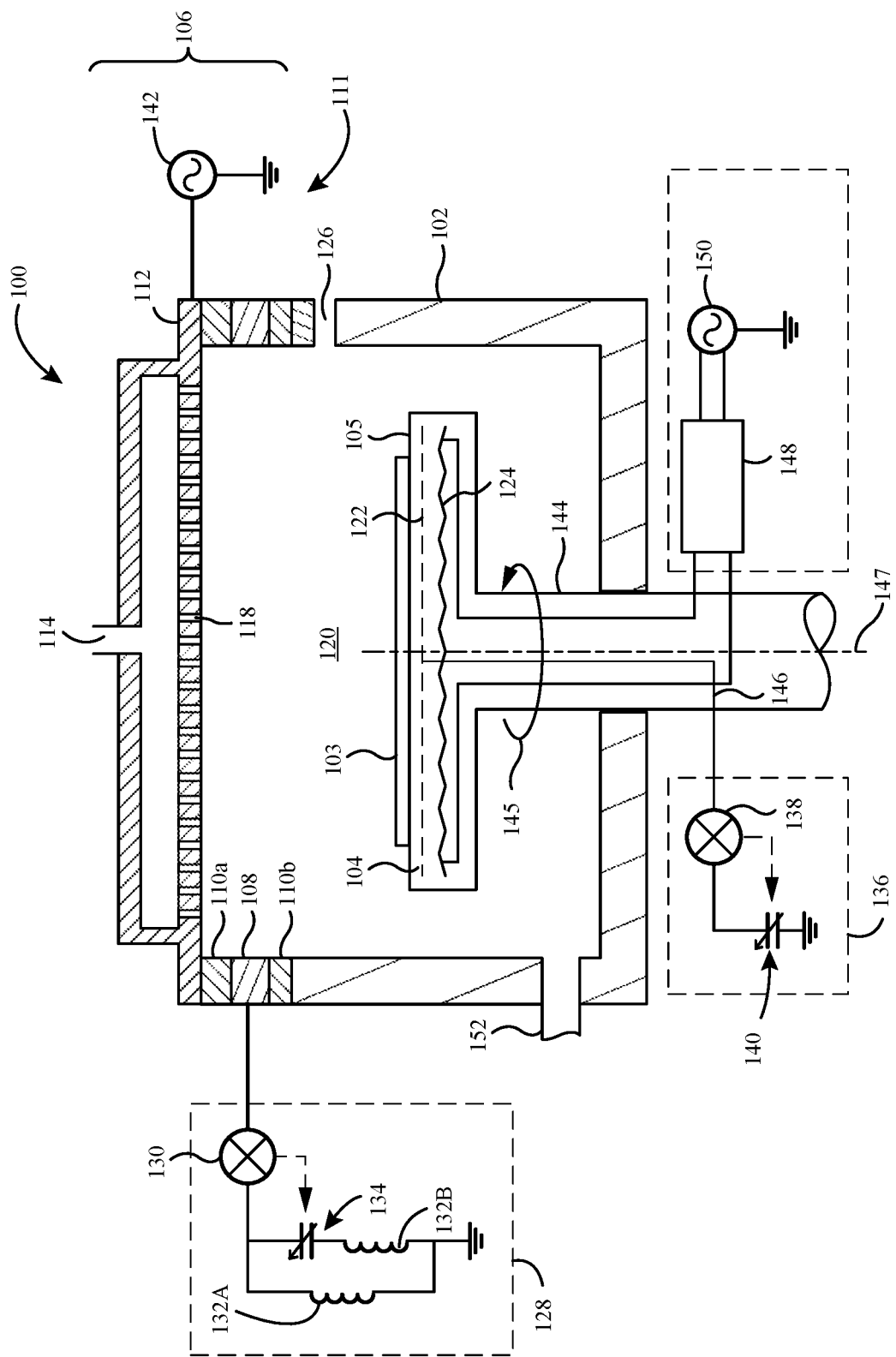
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced, and material property differences across a film may affect device realization and uniformity. Many chambers include a characteristic process signature, which may produce residual non-uniformity across a substrate. Temperature differences, flow pattern uniformity, and other aspects of processing may impact the films on the substrate, creating film uniformity differences across the substrate for materials produced or removed. For example, turbulent deposition gas flow and/or misalignment of apertures of a blocker plate and faceplate of a gas box may lead to +non-uniform flow of deposition gases. Additionally, due to discontinuities near the wafer edge (such as a gap between the wafer edge and a heater pocket), gas flow across the wafer may be non-uniform, which may lead to non-uniform film deposition. In some instances, the blocker plate may not uniformly distribute flow of precursors to edge regions of a substrate. Additionally, in some embodiments a substrate support or heater on which a substrate is disposed may include one or more heating mechanisms to heat a substrate. When heat is delivered or lost differently between regions of a substrate, the film deposition may be impacted where, for example, warmer portions of the substrate may be characterized by thicker deposition or different film properties relative to cooler portions. This temperature non-uniformity may be attributable, for example, to temperature fluctuations about the shaft of the substrate support and may particularly affect edge regions of substrates.

The present technology overcomes these challenges by incorporating a showerhead that includes one or more relief features, such as grooves and/or ridges. The relief features may alter a size of an inter-electrode gap formed between the showerhead and an RF mesh or other electrode of a substrate support. The inter-electrode gap may be increased to reduce plasma generation (and subsequently film deposition) within a localized region of the processing chamber and/or decreased to increase plasma generation within a localized region. These relief features are often annular in shape to help combat radial non-uniformity issues.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as a radio frequency (RF) generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2A:
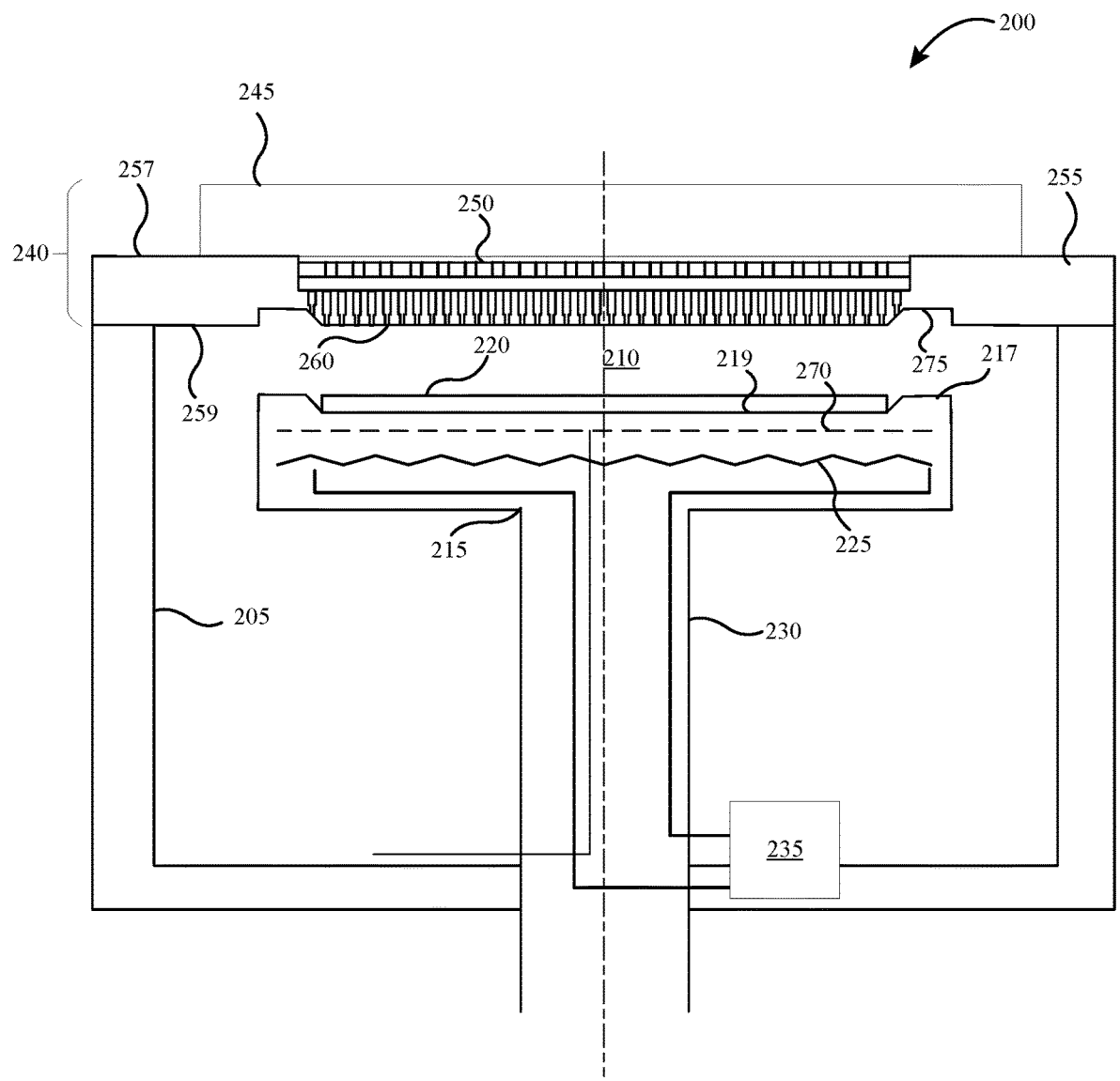
FIG. 2A shows a schematic cross-sectional view of an exemplary processing chamber according to some embodiments of the present technology.

FIG. 2A shows a schematic cross-sectional view of a processing chamber 200 according to some embodiments of the present technology. FIG. 2A may include one or more components discussed above with regard to FIG. 1, and may illustrate further details relating to that chamber. The chamber 200 may be used to perform semiconductor processing operations including deposition of stacks of dielectric materials as previously described. Chamber 200 may show a partial view of a processing region of a semiconductor processing system, and may not include all of the components, such as additional lid stack components previously described, which are understood to be incorporated in some embodiments of chamber 200. The chamber 200 generally may include a chamber body 205 having sidewalls, a bottom wall, and an interior sidewall defining a processing region 210. Processing region 210 may include a substrate support 215 disposed in the processing region 210. The substrate support 215 may provide a heater adapted to support a substrate 220 on an exposed surface of the substrate support, such as a body portion. For example, the substrate support 215 may include a pocket 217 that defines an outer boundary of a substrate support surface 219. The pocket 217 may protrude upward from the substrate support 215, with a top surface of the pocket 217 being substantially aligned with a top surface of the substrate 220. For example, a top surface of the pocket 217 may be within or about 3% of a height of the top surface of the substrate 220, within or about 2% of the height of the top surface of the substrate 220, within or about 1% of the height of the top surface of the substrate 220, within or about 0.5% of the height of the top surface of the substrate 220, or less. For example, for a substrate 220 having a thickness of 1 mm, the height of the top surface of the pocket 217 may be between or about 0.970 mm and 1.030 mm, between or about 0.980 mm and 1.020 mm, between or about 0.990 mm and 1.010 mm, between or about 0.995 mm and 1.005 mm, or about 1 mm. The substrate support 215 may include heating elements 225, for example resistive heating elements, which may heat and control the substrate temperature at a desired process temperature. Substrate support 215 may also be heated by a remote heating element, such as a lamp assembly, or any other heating device.

The body of substrate support 215 may be to a stem 230. The stem 230 may electrically couple the substrate support 215 with a power outlet or power box 235. The power box 235 may include a drive system that controls the elevation and movement of the substrate support 215 within the processing region 210. The stem 230 may also include electrical power interfaces to provide electrical power to the substrate support 215. The power box 235 may also include interfaces for electrical power and temperature indicators, such as a thermocouple interface. A precursor distribution assembly 240 may be coupled with a top portion of the chamber body 205, possibly with one or more intervening components positioned therebetween. The precursor distribution assembly 240 may deliver reactant and cleaning precursors into the processing region 210. The precursor distribution assembly 240 may include a gasbox 245, a blocker plate 250, and/or a showerhead 255. The gasbox 245 may define or provide access into a processing chamber. Blocker plate 250 may be positioned between the gasbox 245 and the substrate support 215. The blocker plate 250 may include or define a number of apertures through the plate. In some embodiments the blocker plate may be characterized by increased central conductance. For example, in some embodiments a subset of apertures proximate or extending about a central region of the blocker plate may be characterized by a greater aperture diameter than apertures radially outward of the central region. This may increase a central flow conductance in some embodiments. A radio frequency ("RF") source (not shown) may be coupled with the gas distribution assembly 240, which may power the gas distribution assembly 240 to facilitate generating a plasma region between the showerhead 255 and the substrate support 215. In some embodiments, the RF source may be coupled with other portions of the chamber body 205, such as the substrate support 215, to facilitate plasma generation. For example, an RF mesh or electrode 270 may be embedded within a body of the substrate support 215 which may be supplied with RF power to facilitate generation of plasma within the processing region 210.

The showerhead 255 may be positioned within the chamber 200 between the blocker plate 250 and the substrate support 215 as illustrated previously. Showerhead 255 may be characterized by a first surface 257 and a second surface 259, which may be opposite the first surface 257. In some embodiments, first surface 257 may be facing towards a blocker plate 250, and/or gasbox 245. Second surface 259 may be positioned to face substrate support 215 within the processing region 210 of chamber 200. For example, in some embodiments, the second surface 259 of the showerhead 255 and the substrate support 215 may at least partially define the processing region 210. Showerhead 255 may define a plurality of apertures 260 defined through the showerhead 255 and extending from the first surface 257 through the second surface 259. Each aperture 260 may provide a fluid path through the showerhead 255, and the apertures 260 may provide fluid access to the processing region of the chamber. Apertures 260 may have generally cylindrical cross-sections in some embodiments. As illustrated, each aperture 260 may have an aperture profile that includes a larger upper portion 262 and a smaller lower portion 264, although other aperture profiles are possible in various embodiments.

Depending on the size of the showerhead 255, and the size of the apertures 260, showerhead 255 may define any number of apertures 260 through the plate, such as greater than or about 1,000 apertures, greater than or about 2,000 apertures, greater than or about 3,000 apertures, greater than or about 4,000 apertures, greater than or about 5,000 apertures, greater than or about 6,000 apertures, or more. As noted above, the apertures 260 may be included in a set of rings extending outward from a central axis of the showerhead 255, and may include any number of rings as described previously. The rings may be characterized by any number of shapes including circular or elliptical, as well as any other geometric pattern, such as rectangular, hexagonal, or any other geometric pattern that may include apertures distributed in a radially outward number of rings. The apertures may have a uniform or staggered spacing, and may be spaced apart at less than or about 10 mm from center to center. The apertures may also be spaced apart at less than or about 9 mm, less than or about 8 mm, less than or about 7 mm, less than or about 6 mm, less than or about 5 mm, less than or about 4 mm, less than or about 3 mm, or less.

The rings may be characterized by any geometric shape as noted above, and in some embodiments, apertures may be characterized by a scaling function of apertures per ring. For example, in some embodiments a first aperture may extend through a center of the faceplate, such as along the central axis as illustrated. A first ring of apertures may extend about the central aperture, and may include any number of apertures, such as between about 4 and about 10 apertures, which may be spaced equally about a geometric shape extending through a center of each aperture. Any number of additional rings of apertures may extend radially outward from the first ring, and may include a number of apertures that may be a function of the number of apertures in the first ring. For example, the number of apertures in each successive ring may be characterized by a number of apertures within each corresponding ring according to the equation XR, where X is a base number of apertures, and R is the corresponding ring number. The base number of apertures may be the number of apertures within the first ring, and in some embodiments may be some other number, as will be described further below where the first ring has an augmented number of apertures. For example, for an exemplary faceplate having 5 apertures distributed about the first ring, and where 5 may be the base number of apertures, the second ring may be characterized by 10 apertures, (5)×(2), the third ring may be characterized by 15 apertures, (5)×(3), and the twentieth ring may be characterized by 100 apertures, (5)×(20). This may continue for any number of rings of apertures as noted previously, such as up to, greater than, or about 50 rings. In some embodiments each aperture of the plurality of apertures across the faceplate may be characterized by an aperture profile, which may be the same or different in embodiments of the present technology.

Figure 2B:
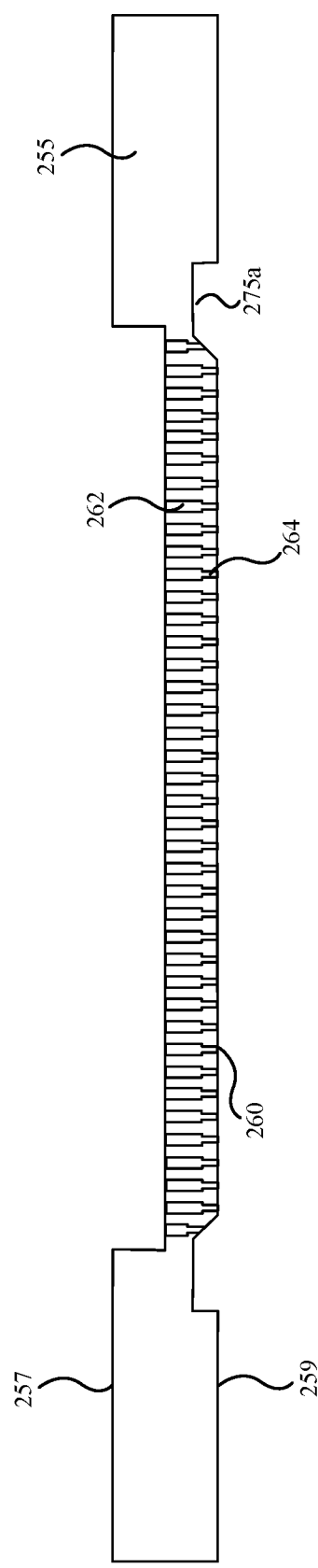
FIG. 2B shows a partial schematic cross-sectional view of a showerhead of FIG. 2A.

As best illustrated in the partial schematic cross-sectional view of FIG. 2B, the second surface 259 of the showerhead 255 may define one or more annular relief features 275. The relief features 275 may extend 360 degrees or less about the second surface 259. Each relief feature 275 may be in the form of a ridge that protrudes downward from the second surface 259 and/or a groove that extends into the second surface 259. For example, as illustrated, relief feature 275a is in the form of an annular groove extending about the second surface 259. A cross-section of the relief feature 275 may be constant and/or vary along a length of the relief feature 275. The relief feature 275 may have any cross-sectional shape. For example, in some embodiments, the relief feature 275 may have a rectangular cross-sectional shape such that a height (for a ridge) or a depth (for a groove) is constant across a width of the relief feature 275. In other embodiments, the cross-section of the relief feature 275 may be tapered and/or contoured such that the height or depth of the relief feature 275 varies across the width of the relief feature 275.

By including grooves and/or protrusions/ridges (relief features 275) within showerhead 255, a deposition rate may be varied at a given position on the substrate 220. This may be due to the change in electric potential between the second surface 259 of the showerhead 255 and the RF mesh 270 when RF power is supplied to the showerhead 255 and the RF mesh 270. This potential depends on a vertical distance between a portion of the second surface 259 of the showerhead 255 and the RF mesh 270. The presence of a ridge relief feature 275 may reduce the vertical distance between the showerhead 255 and the RF mesh 270, which may increase the electrical potential and the deposition rate on a portion of the substrate 220 proximate the relief feature 275. The presence of a groove relief feature 275 may increase the vertical distance between the showerhead 255 and the RF mesh 270, which may decrease the electrical potential and the deposition rate on a portion of the substrate 220 proximate the relief feature 275. In this manner, any number of grooves and/or ridges may be provided in the second surface 259 to vary the vertical distance between the showerhead 255 and the RF mesh 270 along a length of the showerhead 255 to control the deposition rate at one or more areas of the substrate 220.

As illustrated, the relief feature 275a is in the form of an annular groove that has a size and shape that substantially corresponds to a size and shape of the heater pocket 217 (e.g., each dimension of the groove is within or about 10% of a corresponding dimension of the heater pocket 217). An inner edge of the groove may have a taper that corresponds to the taper of the inner edge of the heater pocket 217 and an outer edge of the groove may be contoured to match a contour of the outer edge of the heater pocket 217. An upper surface of the groove may be substantially flat to match a top surface of the heater pocket 217. By positioning the groove above the heater pocket 217 (radially outward of the substrate 220), the effects of the reduced electrical potential may be exhibited at edge regions of the substrate 220 (e.g., an outer 85%, 90%, 95%, 97%, 99%, etc. of a radius of the substrate 220).

A height and/or depth of the relief feature 275 (and resultant change in a spacing between the showerhead 255 and the RF mesh 270) may correspond to a given change in film thickness. As just one example, a spacing change of 1 mil (or other distance) in a given direction may result in a film thickness correction of approximately 210 Å (or other thickness). For example, a 10 mil groove relief feature 275 may result in a reduction of film thickness at a corresponding area of the substrate 220 of approximately 2100 Å, while a 10 mil ridge relief feature 275 may result in an increase of film thickness at a corresponding area of the substrate 220 of approximately 2100 Å. Based on the relationship between the height and/or depth of the relief feature 275 and the film thickness, the size, position, and/or shape of each relief feature 275 may be selected to alter a film thickness profile of a substrate 220. For example, one or more ridge relief features may be positioned on a region of the showerhead 255 that corresponds to an area of low deposition, while one or more groove relief features may be positioned on a region of the showerhead 255 that corresponds to an area of high deposition. The height/depth of a relief feature 275 may be less than or about 200 mils, less than or about 150 mils, less than or about 100 mils, less than or about 90 mils, less than or about 80 mils, less than or about 70 mils, less than or about 60 mils, less than or about 50 mils, less than or about 40 mils, less than or about 30 mils, less than or about 20 mils, less than or about 10 mils, less than or about 5 mils, or less. Oftentimes, the depth/height of each relief feature 275 may be between or about 5 mils and 100 mils.

The height and/or depth of each relief feature 275 across the width of the relief feature 275 may be selected to correspond with a desired change in the film thickness within the given area of the substrate 220. Thus, the size and shape of each relief feature 275 may substantially mimic a peak or valley in the thickness profile of a known film chemistry using a flat showerhead, which may cause the film deposition rate to change to effectively reduce the magnitude of the v and generate a more uniform film thickness across the surface of the substrate 220. For example, if the film in an area of the substrate from about 75% of the radius of the substrate 220 to about 95% of the radius of the substrate 220 is too thick, a groove relief feature 275 may be formed in the showerhead 255 above and/or slightly outward of this area to help decrease the film thickness in this area. Similarly, if the film in an area of the substrate from about 95% of the radius of the substrate 220 to about 98% of the radius of the substrate 220 is too thin, a ridge relief feature 275 may be formed in the showerhead 255 above and/or slightly outward of this area to help increase the film thickness in this area.

The relief features 275 may be formed radially outward of the apertures 260 of the showerhead 255 and/or may be radially inward of the outermost edge of at least one of the apertures 260. For example, as illustrated, a subset of apertures 260a is disposed within relief feature 275a. In such instances, to maintain uniform flow conductance across the showerhead 255, the lower portion 264 of each aperture 260 may be held constant. In the case of apertures 260a, this may result in the upper portion 262a being reduced in length such that the lower portion 264 of each aperture 260a may be a same length as the lower portion 264 of apertures 260 that are not included in the subset.

Figure 2C:
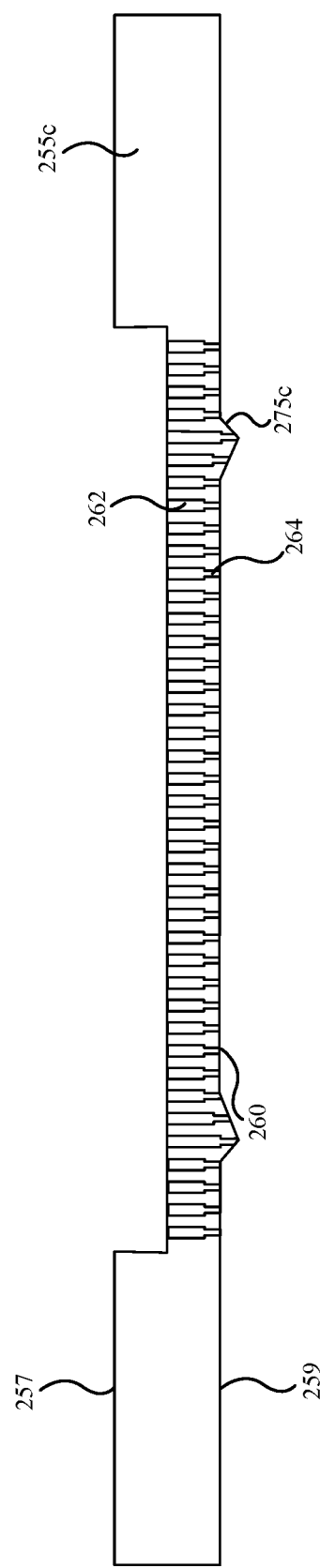
FIG. 2C shows a partial schematic cross-sectional view of a showerhead according to some embodiments of the present technology.
Figure 2D:
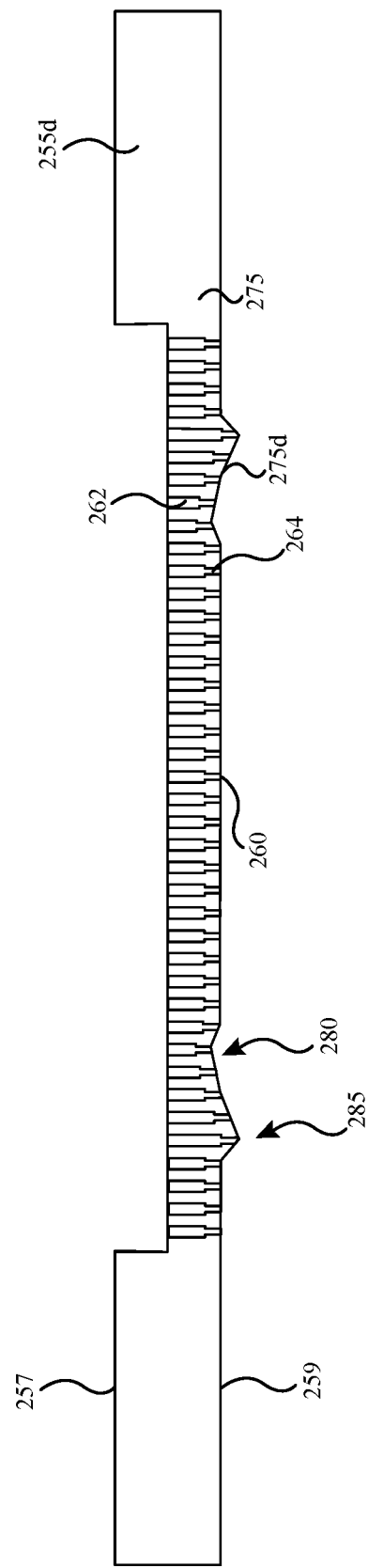
FIG. 2D shows a partial schematic cross-sectional view of a showerhead according to some embodiments of the present technology.

FIG. 2C illustrates a showerhead 255c that may be utilized in chamber 200. For example, showerhead 255b may include a ridge relief feature 275c. Relief structure 275c may be sized, positioned, and/or shaped to increase film deposition in one or more known low regions (which may be determined based on a deposition operation performed using a different showerhead, such as a flat showerhead). While shown as having sharp transition points where the contour changes, it will be appreciated that in some embodiments, the transition points may be rounded and/or otherwise contoured. Such contouring may help prevent flow uniformity issues within the chamber 200. FIG. 2D illustrates a showerhead 255d that may be utilized in chamber 200. For example, showerhead 255d may include a relief feature 275d that includes a groove and a ridge. The groove portion 280 of relief structure 275d may be sized, positioned, and/or shaped to reduce film deposition in one or more known high regions, while the ridge portion 285 of relief feature 275d may be sized, positioned, and/or shaped to increase film deposition in one or more known low regions. While shown here with the groove portion 280 and ridge portion 285 sharing a boundary and being in contact with one another, in some embodiments the groove portion 280 and ridge portion 285 may be radially spaced apart from one another. Additionally, while shown with the groove portion 280 radially inward of the ridge portion 285, it will be appreciated that this relative positioning may be reversed in various embodiments. Additionally, it will be understood that any number and/or combination of groove portions and/or ridge portions may be included in some embodiments.

Figure 3:
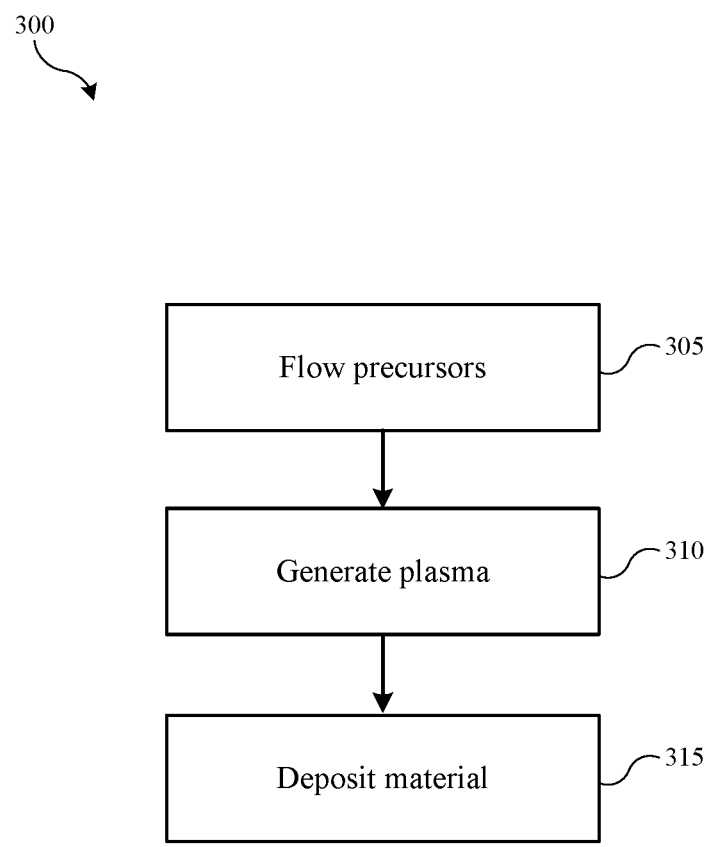
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing chamber 200 described above, which may include showerheads according to embodiments of the present technology, such as showerhead 255. Method 300 may include a number of optional operations, which may or may not be specifically associated with some embodiments of methods according to the present technology.

Method 300 may include a processing method that may include operations for forming a hardmask film or other deposition operations. The method may include optional operations prior to initiation of method 300, or the method may include additional operations. For example, method 300 may include operations performed in different orders than illustrated. In some embodiments, method 300 may include flowing one or more precursors into a processing chamber at operation 305. For example, the precursor may be flowed into a chamber, such as chamber 200, and may flow the precursor through one or more of a gasbox, a blocker plate, or a showerhead, prior to delivering the precursor into a processing region of the chamber.

In some embodiments, the showerhead may define one or more annular relief features, such as grooves and/or ridges. The relief features may alter a size of an inter-electrode gap formed between the showerhead and an RF mesh disposed within a substrate support at discrete locations on the showerhead. This change in gap size may cause a resultant change in deposition rate on a substrate at the locations of the relief features. At operation 310, a plasma may be generated of the precursors within the processing region, such as by providing RF power to the showerhead to generate a plasma. Material formed in the plasma may be deposited on the substrate at operation 315. In some embodiments, the deposited material may be characterized by a thickness at the edge of the substrate that approximately the same as a thickness within a central region of the substrate. For example, the material deposited is characterized by a thickness proximate an edge of the substrate has a target uniformity of less than 1500 A.

Additionally, the thickness at the edge of the substrate may be less than or about 9% greater than a thickness proximate a mid or center region along a radius of the substrate, and may be less than or about 8% greater, less than or about 7% greater, less than or about 6% greater, less than or about 5% greater, less than or about 4% greater, less than or about 3% greater, less than or about 2% greater, less than or about 1% greater, or may be substantially similar or uniform across positions along the substrate. By utilizing a showerhead having one or more relief features that correspond to known areas of high and low film thickness, improved uniformity may be provided.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing chamber, comprising:
a chamber body;
a substrate support disposed within the chamber body, the substrate support defining a substrate support surface; and
a showerhead positioned supported atop the chamber body, wherein:
the substrate support and a bottom surface of the showerhead at least partially define a processing region within the semiconductor processing chamber;
the showerhead defines a plurality of apertures through the showerhead, the plurality of apertures extending from a top surface of the showerhead through the bottom surface of the showerhead; and
the bottom surface of the showerhead defines an annular groove that is positioned directly above at least a portion of the substrate support, and wherein an inner edge, an outer edge, or both an inner edge and an outer edge of the annular groove are tapered, and the annular groove is disposed radially outward of the plurality of apertures.

2. The semiconductor processing chamber of claim 1, wherein:
the substrate support comprises a heater pocket that protrudes upward from an upper surface of the substrate support; and
the annular groove has a size and shape that corresponds to a size and shape of the heater pocket.

3. The semiconductor processing chamber of claim 1, further comprising:
an RF mesh embedded within the substrate support, wherein a vertical distance between the RF mesh and the bottom surface of the showerhead varies across a length of the showerhead.

4. The semiconductor processing chamber of claim 1, wherein:
the bottom surface of the showerhead defines an annular ridge that protrudes downward from the bottom surface.

5. The semiconductor processing chamber of claim 4, wherein:
the annular groove and the annular ridge are in contact with one another.

6. The semiconductor processing chamber of claim 4, wherein:
the annular groove and the annular ridge are spaced apart from one another.

7. The semiconductor processing chamber of claim 1, wherein:
both an inner edge and an outer edge of the annular groove are tapered.

8. The semiconductor processing chamber of claim 1, wherein:
a depth of the groove is between about 5 mils and 100 mils.

9. A semiconductor processing chamber, comprising:
a chamber body;
a substrate support disposed within the chamber body, the substrate support defining a substrate support surface;
a showerhead positioned supported atop the chamber body, wherein:
the substrate support and a bottom surface of the showerhead at least partially define a processing region within the semiconductor processing chamber;
the showerhead defines a plurality of apertures through the showerhead, the plurality of apertures extending from a top surface of the showerhead through the bottom surface of the showerhead; and
the bottom surface of the showerhead defines an annular relief feature, and wherein an inner edge, an outer edge, or both an inner edge and an outer edge of the annular relief feature are tapered, and at least a portion of the annular relief feature is disposed radially outward of the plurality of apertures.

10. The semiconductor processing chamber of claim 9, wherein:
the annular relief feature comprises one or both of a groove and a ridge.

11. The semiconductor processing chamber of claim 9, wherein:
at least a portion of the annular relief feature is disposed radially inward of at least one of the plurality of apertures.

12. The semiconductor processing chamber of claim 11, wherein:
a subset of the plurality of apertures is disposed within the annular relief feature.

13. The semiconductor processing chamber of claim 12, wherein:
each of the plurality of apertures comprises an upper portion and a lower portion, the lower portion having a smaller diameter than the upper portion; and
a lower portion of each of the plurality of apertures within the subset has a same size as each of the plurality of apertures that are not included in the subset.

14. The semiconductor processing chamber of claim 9, wherein:
a depth or a height of the relief feature is constant across a width of the relief feature.

15. The semiconductor processing chamber of claim 9, wherein:
a depth or a height of the relief feature varies across a width of the relief feature.

16. The semiconductor processing chamber of claim 9, wherein:
the bottom surface of the showerhead defines an additional annular relief feature.

* * * * *